(12) United States Patent
Lee et al.

(10) Patent No.: US 7,015,100 B1
(45) Date of Patent: Mar. 21, 2006

(54) METHOD OF FABRICATING ONE-TIME PROGRAMMABLE READ ONLY MEMORY

(75) Inventors: Wen-Fang Lee, Hsinchu (TW); Dave Hsu, Hsinchu (TW); Asam Lin, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/022,204

(22) Filed: Dec. 23, 2004

(51) Int. Cl.
*H01L 21/336* (2006.01)

(52) U.S. Cl. ............... 438/257; 438/258; 438/261; 438/266

(58) Field of Classification Search ............... 438/257, 438/258, 261, 266
See application file for complete search history.

(56) References Cited

U.S. PATENT DOCUMENTS

2004/0108539 A1 * 6/2004 Kim ........................... 257/314

* cited by examiner

*Primary Examiner*—Hsien-Ming Lee
(74) *Attorney, Agent, or Firm*—J.C. Patents

(57) ABSTRACT

A method of fabricating a one-time programmable read only memory of the present invention is provided. First, a substrate having a memory cell area and a peripheral circuit area is provided. The memory cell area includes at least a one-time programmable read only memory cell, while the peripheral circuit area includes at least a logic device. Thereafter, a silicon oxide layer is formed over the substrate to cover the one-time programmable read only memory cell, the logic device and the exposed surface of the substrate. Next, a silicon nitride layer is formed on the silicon oxide layer. Then, the silicon nitride layer and the silicon oxide layer in the peripheral circuit area are removed, and the retained silicon nitride layer and silicon oxide layer in the memory cell area are as a salicide blocking layer (SAB). Thereafter, a salicide process is performed.

7 Claims, 3 Drawing Sheets

METHOD OF FABRICATING ONE-TIME PROGRAMMABLE READ ONLY MEMORY

BACKGROUND OF THE INVENTION

1. Field of the Invention

The present invention relates to a method of fabricating a memory device. More particularly, the present invention relates to a method of fabricating a one-time programmable read only memory (OTPROM).

2. Description of the Related Art

With the power of microprocessors continues to expand, the amount of computation in given software programs increases exponentially. As a result, there is an urgent demand for cheap and high storage capacity memories from semiconductor manufacturers. According to the difference in read/write capability, memories can be roughly classified into read only memory (ROM) and random access memory (RAM).

Read only memory is a type of non-volatile data storage device that can retain stored data even when the power is cut off. Hence, most standard electrical products are equipped with some read only memory for holding a normal operation.

According to data storage format, read only memory (ROM) can be further sub-divided into mask ROM, one-time programmable ROM (OTPROM), erasable programmable ROM (EPROM), electrically erasable programmable ROM (EEPROM) and so on. Since data can be programmed into a one-time programmable ROM outside the factory according to the particular environment the memory is supposed to be working in, one-time programmable ROM is more convenient to work with than the mask ROM.

In the other hand, a single semiconductor chip are usually divided into a memory cell area and a peripheral circuit area, wherein the memory cell area includes at least a memory cell, while the peripheral circuit area includes at least a logic device. For cases in which both memory cells and logic devices are used on the single semiconductor chip, low sheet resistances are needed for the logic devices, while higher sheet resistances are needed for the memory cells. Therefore, salicide layers are formed on the logic devices needing low sheet resistances to fabricate the higher performing devices, while other regions of the semiconductor chip, not requiring the lower sheet resistances, have been masked from the salicide process.

The masking of the higher sheet resistance devices, during the process used to form salicide layers on the requiring low sheet resistance regions, is usually accomplished using a silicon oxide layer. The silicon oxide layer is formed by a plasma-enhanced chemical vapor deposition (PECVD), and its thickness is about 500 Å. In addition, because the silicon oxide layer cannot react with metal in the following salicide step, the silicon oxide layer is also named as a salicide blocking layer (SAB).

Furthermore, in the current trend of driver IC, in order to simply the entire process and reduce wafer cost, the single poly OTPROM, which has only one gate over a substrate, with standard logic process is the best candidate. However, in the standard logic process flow, the SAB layer will induce poor OTP retention issue because it cannot block mobile ion intrusion and cause charge gain and charge loss.

SUMMARY OF THE INVENTION

Accordingly, the present invention is directed to a method of fabricating one-time programmable read only memory, which is capable of resolving the aforementioned problems that charge stored in the OTP memory cell may easily lose.

The method of fabricating a one-time programmable read only memory of the present invention is described as follows. First, a substrate having a memory cell area and a peripheral circuit area is provided. The memory cell area includes at least a one-time programmable read only memory cell, while the peripheral circuit area includes at least a logic device. Thereafter, a silicon oxide layer is formed over the substrate to cover the one-time programmable read only memory cell, the logic device and the exposed surface of the substrate. Next, a silicon nitride layer is formed on the silicon oxide layer. Then, the silicon nitride layer and the silicon oxide layer in the peripheral circuit area are removed, and the retained silicon nitride layer and silicon oxide layer in the memory cell area are as a salicide blocking layer (SAB). Thereafter, a salicide process is performed.

Since the above salicide process utilizes double layers, the silicon nitride layer and the silicon oxide layer, as a salicide blocking layer (SAB), the aforementioned problems can be resolved. Especially, the silicon nitride layer can block mobile ion intrusion during the salicide process, the mobile ion intrusion and charge loss can be resolved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
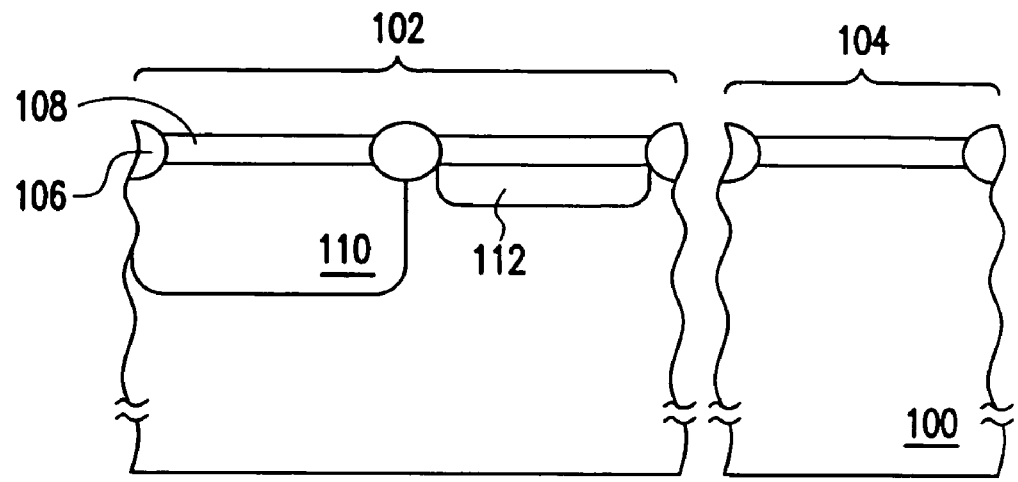
FIG. 1A to FIG. 1F are cross-sectional views illustrating a manufacturing process of a one-time programmable read only memory (OTPROM) according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are cross-sectional views illustrating a manufacturing process of a one-time programmable read only memory (OTPROM) according to one embodiment of the present invention. The OTPROM comprises an OTPROM cell disposed in memory cell area 102 and a logic device disposed in peripheral circuit area 104.

Referring to FIG. 1A, in the method of manufacturing the OTPROM of the present invention, for example, a substrate 100 having a memory cell area 102 and a peripheral circuit area 104 is provided first. In one embodiment of the present invention, the areas described above are, for example but not limited to, defined by component isolation area 106. The component isolation area 106 is, for example but not limited to, formed by local oxidation (LOCOS) process, shallow trench isolation (STI) process or other applicable process.

Then, a dielectric material layer 108 is formed on the substrate 100. The material of the dielectric material layer 108 comprises, for example but not limited to, silicon oxide or other applicable material. The dielectric material layer 108 is, for example but not limited to, formed by thermal oxidation process or other applicable process. In one embodiment of the present invention, before the dielectric material layer 108 is formed, further comprises forming a p-type well region 110 in the substrate 100 of the memory cell area 102. The well region 110 is formed by, for example but not limited to, ion implant process. Thereafter, an n-type doped region 112 is formed in the substrate 100 of the memory cell area 102 and used as a control gate. The n-type doped region 112 is formed by, for example but not limited to, ion implant process.

Figure 1B:
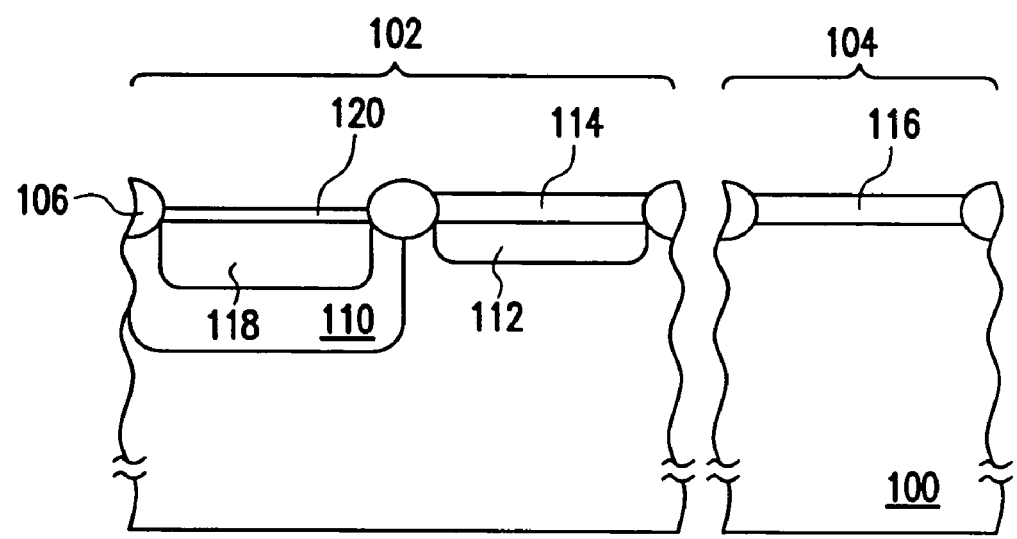

Then, referring to FIG. 1B, the dielectric material layer 108 on the p-type well region 110 in the memory cell area 102 is removed, and a portion of the surface of the substrate 100 is exposed. The portion of the dielectric material layer 108 is removed by, for example but not limited to, dry etching process, wet etching process or other applicable process. A portion of the residual dielectric material layer 108 in the memory cell area 102 is used as an inter-gate dielectric layer 114, and a portion of the residual dielectric material layer 108 in the peripheral circuit area 104 is used as a gate dielectric layer 116.

In one embodiment of the present invention, before a portion of the dielectric material layer 108 is removed, the method further comprises forming a doped region 118 in the p-type well region 110 of the memory cell area 102. Therefore, the dopant concentration of the predetermined channel area is adjusted, and the threshold voltage of the memory device is adjusted.

Then, a dielectric material layer is formed over the substrate 100, and is used as a tunnel layer 120. The material of the dielectric material layer 120 comprises, for example but not limited to, silicon oxide or other applicable material. The dielectric material layer 120 is formed by, for example but not limited to, thermal oxidation process or other applicable process. In the meanwhile, the thickness of the inter-gate dielectric layer 114 and the gate dielectric layer 116 is also increased.

Figure 1C:
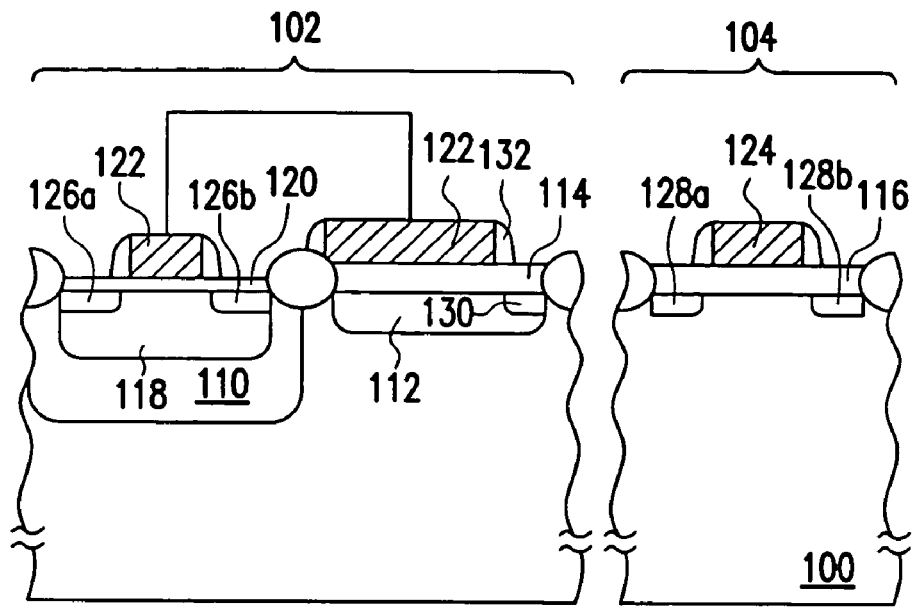

Then, referring to FIG. 1C, a floating gate 122 is formed on the inter-gate dielectric layer 114 and the tunnel layer 120 of the memory cell area 102, and a gate 124 is formed on the gate dielectric layer 116 of the peripheral circuit area 104 respectively. Wherein the floating gate 122 on the inter-gate dielectric layer 114 and the floating gate 122 on the tunnel layer 120 are electronically connected each other. In addition, the material of the floating gate 122 and the gate 124 comprises, for example but not limited to, polysilicon, doped polysilicon or other applicable conductive material. In addition, the floating gate 122 and the gate 124 are formed by, for example but not limited to, conventional manufacturing process of gate.

Then, an n-type source region 126a and a drain region 126b are formed in the substrate 100 beside two sides of the floating gate 122 under the tunnel layer 120 in the memory cell area 102. Another source region 128a and another drain region 128b are formed in the substrate 100 beside two sides of the gate 124 in the peripheral circuit area 104. The source region and the drain region described above are formed by, for example but not limited to, ion implant process using dopant. In one embodiment of the present invention, during the n-type source region 126a and drain region 126b are formed, the method further comprises forming an n-type densely doped region 130 in the doped region 112 beside the floating gate 122 of the memory cell area 102. The n-type densely doped region 130 may be used as a portion of the control gate to increase the conductivity of the control gate.

In addition, in one embodiment of the present invention, before or after the source region and the drain region are formed, the method further comprises forming a lightly doped drain region (not shown) in the substrate 100 beside two sides of the floating gate 122 and the gate 124. Therefore, the dopant concentration of the source region and the drain region can be adjusted. The lightly doped drain region is formed by, for example but not limited to, pocket type ion implant process or conventional ion implant process using the spacer 132.

Figure 1D:
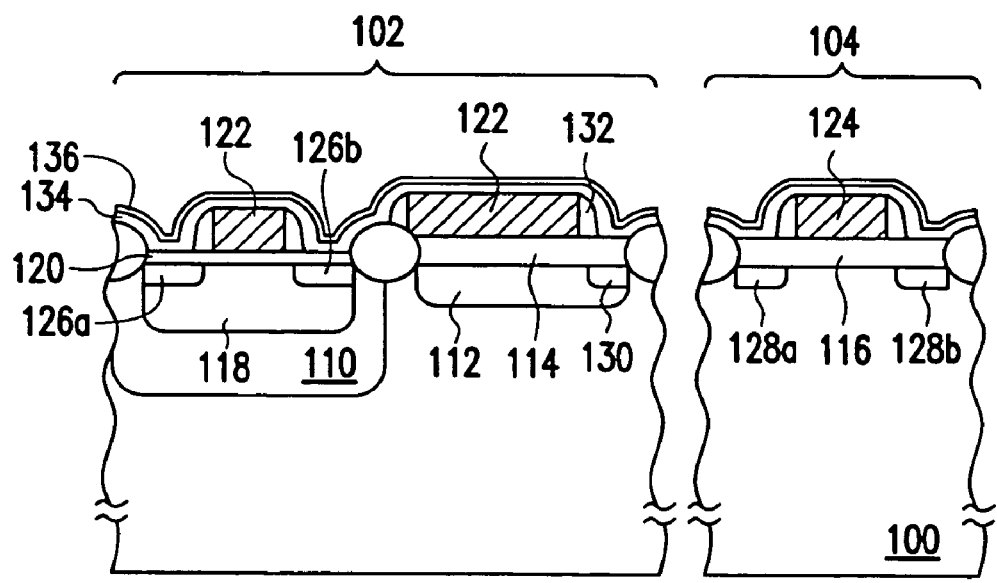

Thereafter, referring to FIG. 1D, a silicon oxide layer 134 is formed over the substrate 100 to cover the floating gate 122, the gate 124, the spacer 132 and the exposed surface of the substrate 100. The silicon oxide layer 134 is formed by, for example but not limited to, low pressure chemical vapor deposition (LPCVD), and its thickness is about 200 Å. It is noted that the silicon oxide layer formed by LPCVD is able to eliminate the plasma damage compared to the prior art using PECVD.

Next, a silicon nitride layer 136 is formed on the silicon oxide layer 134. The silicon nitride layer 136 is formed by, for example but not limited to, low pressure chemical vapor deposition (LPCVD), and its thickness is about 160 Å. It is noted that the silicon nitride layer 136 can block mobile ion intrusion during the following salicide process, so the mobile ion intrusion and charge can be resolved.

Figure 1E:
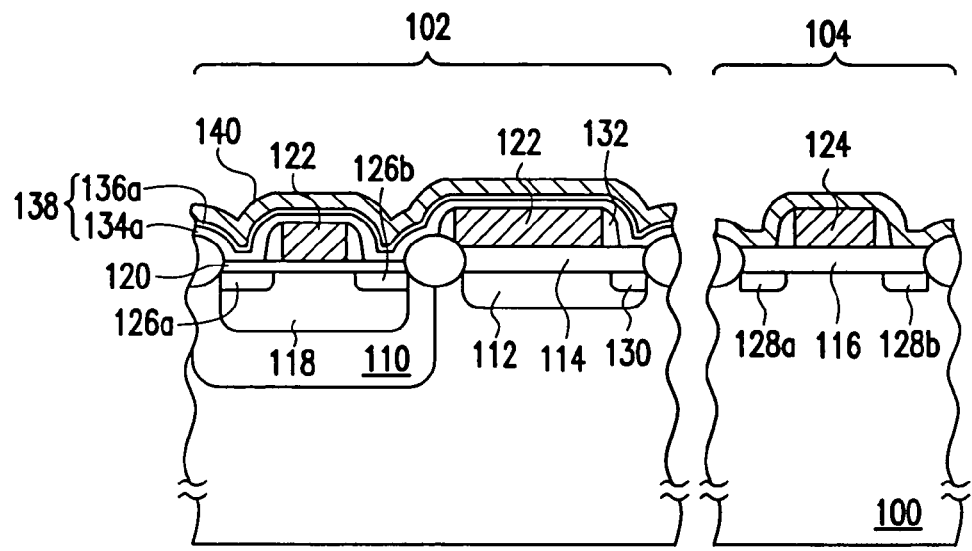

Then, referring to FIG. 1E, the silicon nitride layer 136 and the silicon oxide layer 134 in the peripheral circuit area 104 are removed, and the retained silicon nitride layer 136a and silicon oxide layer 134a in the memory cell area 102 are as a salicide blocking layer (SAB) 138. It is noted that the salicide blocking layer 138 cannot react with metal material in the following salicide process.

Thereafter, a salicide process is performed. Referring to FIG. 1E, a metal layer 140 is formed over the substrate 100 to cover the salicide blocking layer 138, the gate 124, the spacer 132 and the exposed surface of the substrate 100. The material of the metal layer 140 comprises, for example but not limited to, tungsten, titanium, tantalum, zirconium, hafnium or other applicable metal material. The metal layer 140 is formed by, for example but not limited to, chemical vapor deposition (CVD), physical vapor deposition (PVD) or other applicable process.

Figure 1F:
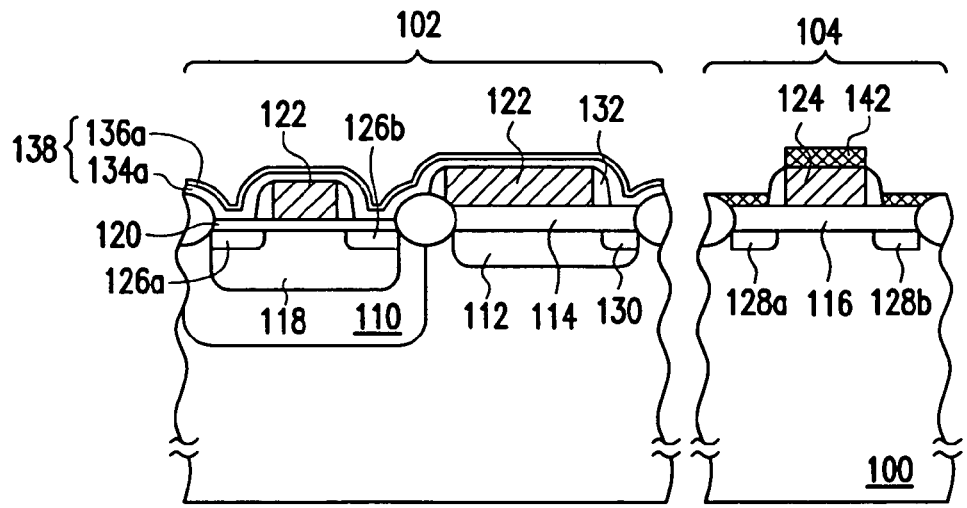

Referring to FIG. 1F, after the metal layer 140 is formed, a salicide step is performed, and a portion of the metal layer is formed a salicide layer 142. The salicide step is for example but not limited to, thermal process, anneal process or other applicable process. In the salicide step, the metal layer 140 may react with the silicon in the layers contacting with the metal layer 140, such as the source region 128a and drain region 128b in the substrate 100 or the gate 124, to form the salicide layer 142. Finally, the retained metal layer 140 is removed.

Since the above salicide process utilizes double layers, the silicon nitride layer and the silicon oxide layer, as a salicide blocking layer, the silicon nitride layer can block mobile ion intrusion during the salicide process, the mobile ion intrusion and charge loss can be resolved.

An experiment is performed for two memory devices having different components in salicide blocking layers (SAB). In memory device 1 (prior art), the SAB is a silicon oxide layer formed by PECVD. In memory device 2 (present invention), the SAB is a double layer of a silicon oxide layer and a silicon nitride layer formed by LPCVD. In addition, tests are individually a measurement of program threshold voltage (Vt(PGM)), and a measurement of threshold voltage performed after the chip is baked at 150° C. for 72 hrs (Vt(baked, 150° C., 72 hrs)). Furthermore, "charge loss" means the differences of above measurements of threshold voltage.

TABLE 1

| Test | Memory 1 (prior art) | Memory 2 (present invention) |
| --- | --- | --- |
| Vt(PGM) | 8.1 | 7.8 |
| Vt (baked, 150° C., 72 hrs) | 5.28 | 7.26 |
| Charge loss | −2.82 | −0.54 |

In table 1, we know the SAB in the present invention can make charge retain in the memory device and without current leakage. Therefore, the memory of the present invention has better performance.

Accordingly, the present invention has the advantages described below. First, since the above salicide process utilizes double layers, the silicon oxide layer and the silicon nitride layer, as a salicide blocking layer, the aforementioned problems can be resolved. Especially, the silicon oxide layer is formed by LPCVD, so it is able to eliminate the plasma damage compared to the prior art. In addition, the silicon nitride layer can block mobile ion intrusion during the salicide process, so the mobile ion intrusion and charge can be resolved.

Furthermore, in the OTPROM cell of the present invention, only the floating gate is formed over the substrate. The control gate formed in the substrate as a doped region. Therefore, the integration of the OTPROM cell of the present invention with the component having a single gate in the general peripheral circuit area is easy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a one-time programmable read only memory, comprising:
    providing a substrate comprising a memory cell area and a peripheral circuit area, wherein the memory cell area includes at least a one-time programmable read only memory cell, while the peripheral circuit area includes at least a logic device;
    forming a silicon oxide layer over the substrate to cover the one-time programmable read only memory cell, the logic device and the exposed surface of the substrate;
    forming a silicon nitride layer on the silicon oxide layer;
    removing the silicon nitride layer and the silicon oxide layer in the peripheral circuit area, wherein the retained silicon nitride layer and silicon oxide layer in the memory cell area are as a salicide blocking layer (SAB); and
    performing a salicide process.

2. The method of claim 1, wherein forming the silicon nitride layer comprises:
    performing a low pressure chemical vapor deposition (LPCVD).

3. The method of claim 1, wherein the thickness of the silicon nitride layer is 160 Å.

4. The method of claim 1, wherein forming the silicon oxide layer comprises:
    performing a low pressure chemical vapor deposition (LPCVD).

5. The method of claim 1, wherein the thickness of the silicon oxide layer is 200 Å.

6. The method of claim 1, wherein the method for forming the one-time programmable read only memory cell and the logic device comprises:
    forming a tunnel layer and an inter-gate dielectric layer on the surface of the substrate in the memory cell area respectively, and forming a gate dielectric layer on the surface of the substrate in the peripheral circuit area;
    forming a doped region used as a control gate in the substrate under the inter-gate dielectric layer;
    forming a floating gate on the inter-gate dielectric layer and the tunnel layer of the memory cell area, and forming a gate on the gate dielectric layer of the peripheral circuit area; and
    forming a first source region and a first drain region in the substrate of two sides of the floating gate under the tunnel layer of the memory cell area, and forming a second source region and a second drain region in the substrate of two sides of the gate of the peripheral circuit area.

7. The method of claim 1, wherein the salicide process comprises:
    forming a metal layer over the substrate to cover the salicide blocking layer, the logic device in peripheral circuit area, and the exposed surface of the substrate;
    performing a salicide step, wherein a portion of the metal layer is formed a salicide layer; and
    removing the retained metal layer.

* * * * *